(12) United States Patent
Lopez Julia et al.

(10) Patent No.: US 12,514,030 B2
(45) Date of Patent: Dec. 30, 2025

(54) NARROWBAND REFLECTOR FOR MICRO-LED ARRAYS

(71) Applicant: Lumileds Singapore Pte. Ltd., Singapore (SG)

(72) Inventors: Antonio Lopez Julia, Vaals (NL); Nicola Bettina Pfeffer, Eindhoven (NL); Oleg Borisovich Shchekin, San Francisco, CA (US)

(73) Assignee: Lumileds Singapore Pte. Ltd., Singapore (SG)

( * ) Notice: Subject to any disclaimer, the term of this patent is extended or adjusted under 35 U.S.C. 154(b) by 484 days.

(21) Appl. No.: 17/964,438

(22) Filed: Oct. 12, 2022

(65) Prior Publication Data

US 2023/0122492 A1    Apr. 20, 2023

Related U.S. Application Data

(60) Provisional application No. 63/255,572, filed on Oct. 14, 2021.

(51) Int. Cl.
*H10H 20/814* (2025.01)
*H10H 20/857* (2025.01)
*H10H 29/14* (2025.01)

(52) U.S. Cl.
CPC ........ *H10H 20/814* (2025.01); *H10H 20/857* (2025.01); *H10H 29/142* (2025.01)

(58) Field of Classification Search
None
See application file for complete search history.

(56) References Cited

U.S. PATENT DOCUMENTS

| 10,388,627 B1* | 8/2019 | Chen | H01L 24/83 |
| 2001/0010449 A1* | 8/2001 | Chiu | H10H 20/82 |
| | | | 313/498 |

(Continued)

FOREIGN PATENT DOCUMENTS

| JP | 2016109932 A | 6/2016 |
| JP | 2017208366 A | 11/2017 |

(Continued)

OTHER PUBLICATIONS

"International Application Serial No. PCT/US2022/046558, International Search Report mailed Feb. 13, 2023", 4 pgs.

(Continued)

*Primary Examiner* — Feifei Yeung Lopez
(74) *Attorney, Agent, or Firm* — Schwegman, Lundberg & Woessner, P.A.

(57) ABSTRACT

A structure and method of micro-LEDs are described. The micro-LEDs have a GaN semiconductor structure containing a multi-quantum well active region configured to emit light of a visible wavelength range and a multilayer reflector structure that includes a distributed Bragg reflector (DBR) with a maximum reflectance at the visible wavelength range and to reflect the light emitted by the active region towards an emission surface of the semiconductor structure. The multilayer reflector structure also has a protective layer between the DBR and the GaN structure that is transparent to light of visible wavelengths. The multilayer reflector structure also has an absorbing metal layer that absorbs the light of visible wavelengths. A conductive material provides electrically contact to the semiconductor structure.

20 Claims, 10 Drawing Sheets

(56) References Cited

U.S. PATENT DOCUMENTS

| | | | |
|---|---|---|---|
| 2002/0030194 A1* | 3/2002 | Camras | H10H 20/855 257/E33.068 |
| 2009/0283779 A1* | 11/2009 | Negley | F21K 9/69 257/98 |
| 2017/0125641 A1 | 5/2017 | Jeon et al. | |
| 2017/0179097 A1* | 6/2017 | Zhang | H10H 29/142 |
| 2018/0130926 A1* | 5/2018 | Huang | H10H 20/841 |
| 2018/0204974 A1* | 7/2018 | Boutami | H10H 20/821 |
| 2020/0058825 A1* | 2/2020 | Jang | H10H 20/816 |

FOREIGN PATENT DOCUMENTS

| | | |
|---|---|---|
| KR | 20180059406 A | 6/2018 |
| KR | 20180101026 A | 9/2018 |

OTHER PUBLICATIONS

"International Application Serial No. PCT/US2022/046558, Written Opinion mailed Feb. 13, 2023", 5 pgs.
"European Application Serial No. 22881773.0, Response to Communication Pursuant to Rules 161 and 162 EPC filed Sep. 20, 2024", 15 pgs.
"European Application Serial No. 22881773.0, Extended European Search Report mailed Sep. 8, 2025", 10 pgs.

* cited by examiner

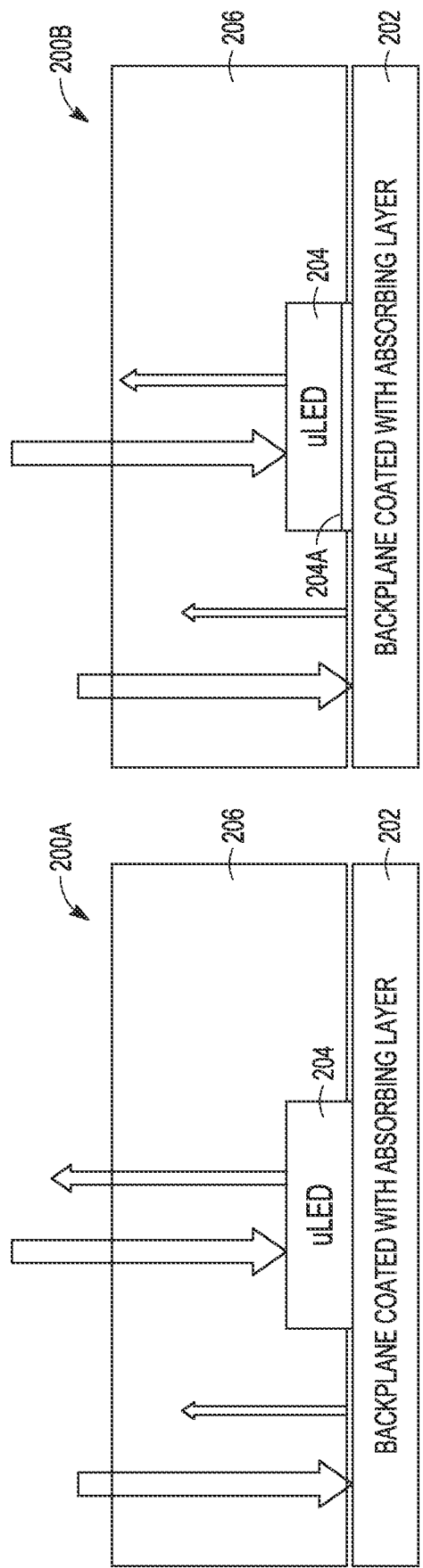

NARROWBAND REFLECTOR FOR MICRO-LED ARRAYS

PRIORITY CLAIM

This application claims the benefit of priority to U.S. Provisional Patent Application Ser. No. 63/255,572, filed Oct. 14, 2021, which is incorporated herein by reference in its entirety.

TECHNICAL FIELD

The present disclosure relates generally to micro-light-emitting diodes (LEDs) and LED arrays, and, more specifically, to modifying the reflectance characteristics of micro-LEDs and micro-LED arrays.

BACKGROUND

The field of micro-light-emitting diode (micro-LED) arrays is an emerging technology in lighting and display industries. Micro-LED arrays often include thousands to millions of microscopic light-emitting diode (LED) pixels that can emit light and that can be individually controlled or controlled in groups of pixels (e.g., 5×5). Micro-LED arrays may provide higher brightness and better energy efficiency than other lighting technologies and display technologies, which can make the Micro-LED arrays desirable for multiple different applications, such as televisions, automotive headlamps, and mobile phones among others.

BRIEF DESCRIPTION OF THE DRAWINGS

To provide a more complete understanding and features and advantages thereof, reference is made to the following description, taken in conjunction with the accompanying figures, wherein like reference numerals represent like parts, in which:

FIG. 2A illustrates a simplified cross-sectional schematic view of a backplane with microLEDs, according to some embodiments.

FIG. 2B illustrates a simplified cross-sectional schematic view of another backplane with microLEDs, according to some embodiments.

DETAILED DESCRIPTION

The systems, methods, and devices of this disclosure may include one or more innovative aspects, where the innovative aspects may individually or in combination contribute to the desirable attributes disclosed herein. Details of one or more implementations of the subject matter described in this specification are set forth in the description below and the accompanying drawings.

As above, microLEDs are small (e.g., <0.01 mm on a side) red, green, and blue inorganic LEDs arranged in a matrix. The inorganic material (e.g., InGaAsP, AlGaAs, etc.,) is more robust than the organic LEDs, for example in terms of mechanical strength, lifetime, luminance degradation, resilience to physical or liquid damage or intrusion, and response in strong ambient lighting conditions, among others. In addition, the microLEDs allow direct emission and can be more efficient than the conventional combination of backlight and liquid crystal display (LCD).

One challenge in directly emissive displays is the reduction in contrast due to ambient lighting. Where polarizers in a path that includes the backlight and LCD can reduce unwanted reflection from the ambient (e.g., daylight) lighting in conventional displays, the emissive display can be about twice as efficient if no polarizers are used (as the LED light is not polarized).

Figure 1:
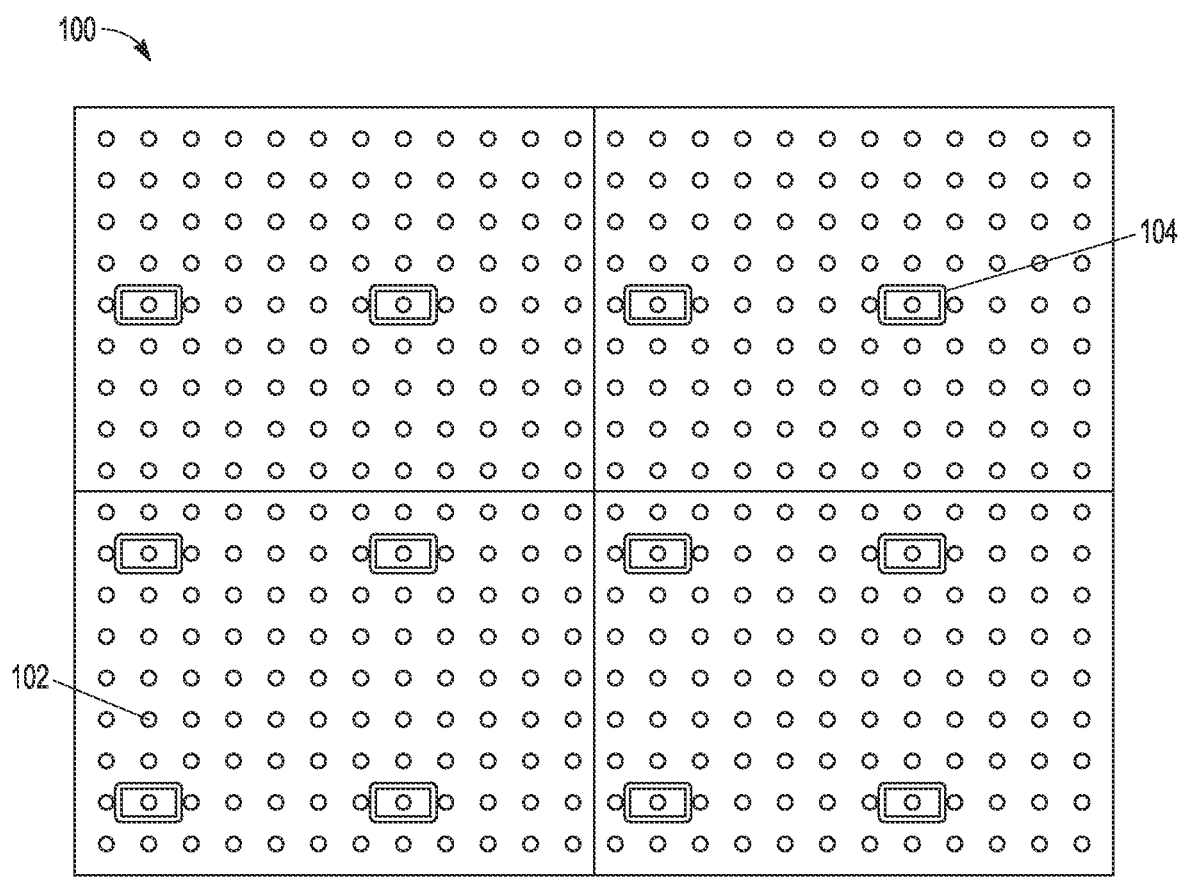
FIG. 1 illustrates a top view of a microLED display, according to some embodiments.

For a microdisplay, the area populated with LEDs is relatively small and the backplane can be optically absorbing (e.g., black), reducing the ambient reflectance significantly as well. With higher density displays however, the microLEDs can occupy 5% of the total area and—being designed for high output—have a highly reflecting backside. This highly reflecting backside is shown in FIG. 1, which illustrates a top view of a microLED display, according to some embodiments. The microLED display 100 contains multiple small squares that includes highly reflecting microLEDs 102 saturating the camera locally. The rectangular features are black coated ICs 104 used to drive the microLEDs 102.

FIG. 2A illustrates a simplified cross-sectional schematic view of a backplane with microLEDs, according to some embodiments. FIG. 2B illustrates a simplified cross-sectional schematic view of another backplane with microLEDs, according to some embodiments. The structure 200a shown in FIG. 2A contains a backplane 202 and an individual microLED 204 that are both coated with an encapsulant 206. The backplane 202 is coated with an absorbing layer (not shown) that absorbs visible light (about 400-800 nm). The encapsulant 206 may be formed from, for example, glass or another material that is substantially transparent to at least visible light. Thus, the majority of ambient light impinging on the backplane is absorbed, although a small portion of this light may be reflected. Notably, however, the majority of ambient light impinging on the microLED 204 is reflected.

Like FIG. 2A, the structure 200b shown in FIG. 2B contains a backplane 202 and an individual microLED 204. The backplane 202 is coated with an absorbing layer (not shown) that absorbs visible light. However, a narrow-band photonic filter 204a is fabricated as bottom reflector in the microLED 204. The narrow-band photonic filter 204a preferentially reflects the spectral component corresponding to the emission wavelength of the microLED 204 and substantially absorbs the remaining wavelengths, as shown by the size of the arrows shown in FIGS. 2A and 2B. The total ambient reflection may thereby be reduced.

Figure 3A:
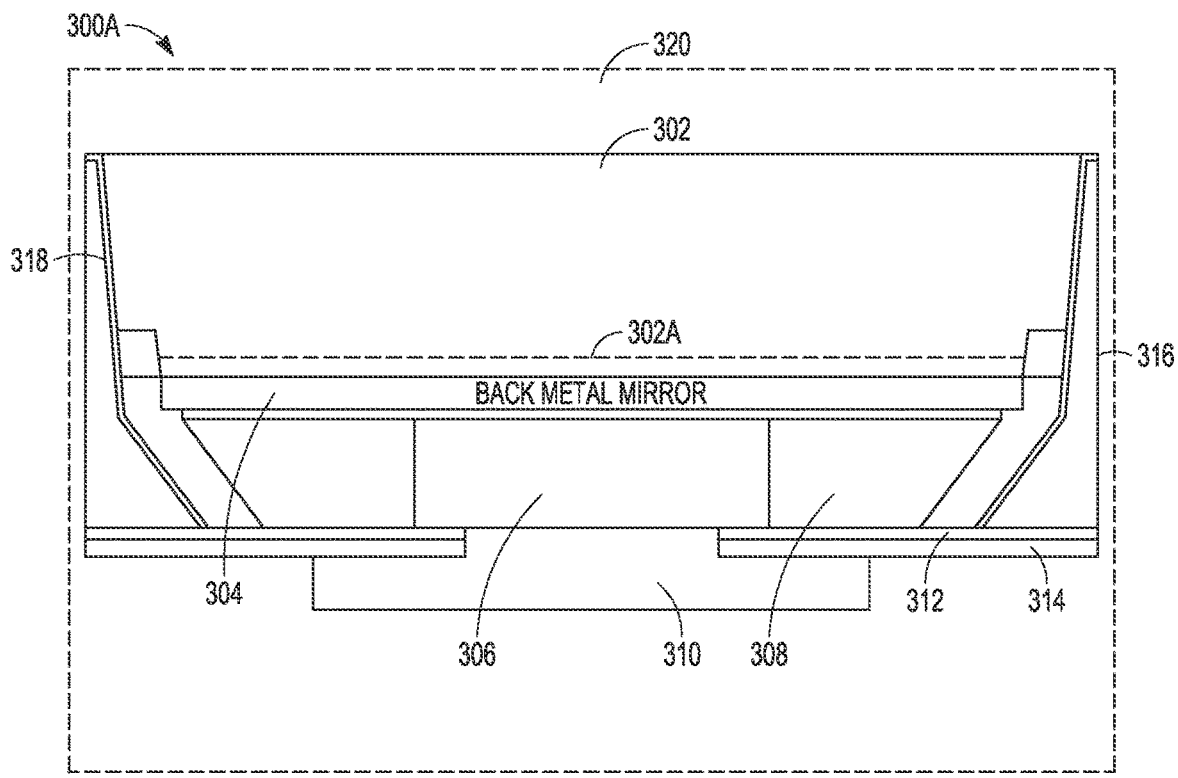
FIG. 3A illustrates a cross-sectional schematic view of a microLED structure, according to some embodiments.
Figure 3B:
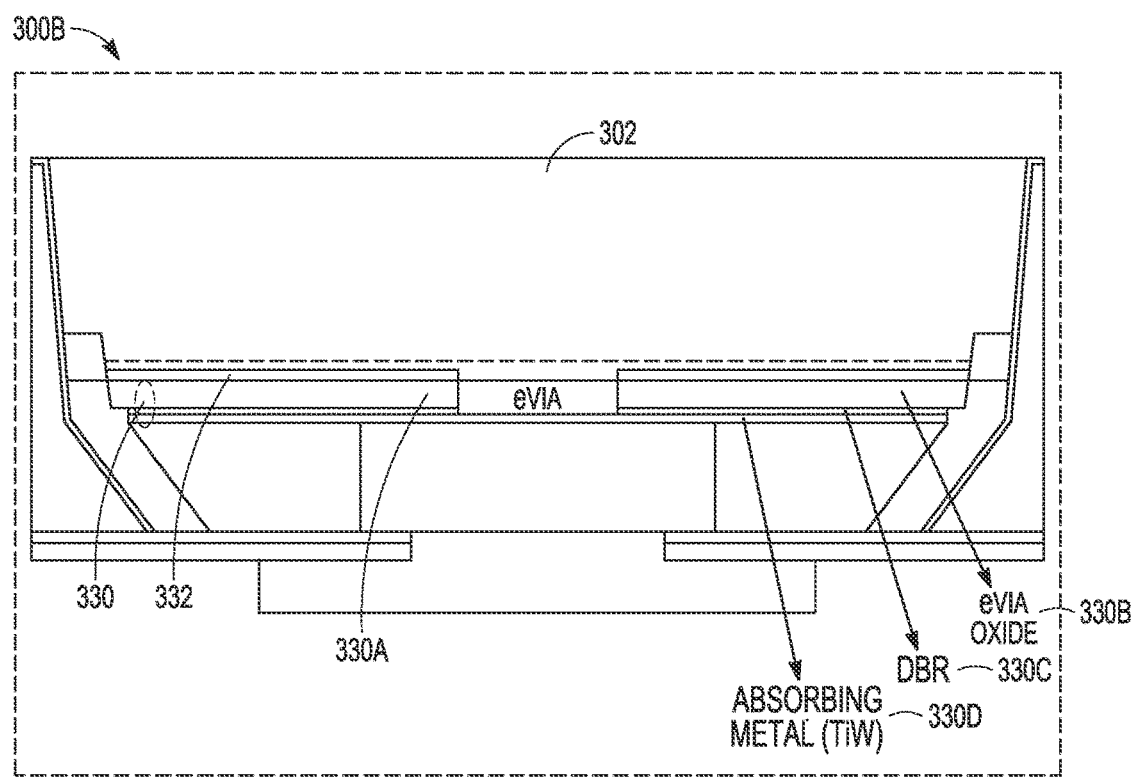
FIG. 3B illustrates a cross-sectional schematic view of another microLED structure, according to some embodiments.

FIG. 3A illustrates a cross-sectional schematic view of a microLED structure, according to some embodiments. FIG. 3B illustrates a cross-sectional schematic view of another microLED structure, according to some embodiments. The microLED structure 300a shown in FIG. 3A contains a multilayer semiconductor stack 302 surrounded laterally by a side oxide layer 316 and side metal contact layer 318 and covered with an encapsulant 320. The encapsulant 320 may be formed from, for example, glass or another material that is substantially transparent to at least visible light. In some embodiments, the side oxide layer 316 may be formed from a non-oxide based dielectric material. The multilayer semiconductor stack 302 may be formed using compound semiconductor layers. The thickness of the multilayer semiconductor stack 302 from a top surface of the multilayer semiconductor stack 302 (the emission surface of the microLED structure 300a) may range from about 4 µm-about 10 µm, for example. The semiconductor layers may be formed from doped GaN or a ternary or quaternary semiconductor compound such as InGaN/AlInGaN/AlGaN to permit the multilayer semiconductor stack 302 to emit light of a desired visible wavelength (e.g., red, green, blue). In particular, in some embodiments the multilayer semiconductor stack 302 may have an active region 302a formed from one or more quantum wells. The size and material forming the quantum well(s) determine the wavelength of the light to be emitted from the multilayer semiconductor stack 302.

The side oxide layer 316 may be formed from $SiO_2$, for example, and may range from about 0.5 µm-about 2.0 µm or more. As indicated, the thickness of the side oxide layer 316, as shown, may vary with increasing depth from the top surface of the multilayer semiconductor stack 302. Also as shown, the side metal contact layer 318 is formed along the surface of the side oxide layer 316. The side metal contact layer 318 may be in contact with an n region of the multilayer semiconductor stack 302 (e.g., GaN). As shown, the side metal contact layer 318 may be exposed at a top surface (adjacent to the top surface of the multilayer semiconductor stack 302) and used to provide a voltage only to a top of the active region 302a. Thus, as shown, the side metal contact layer 318 may contact only the top portion of the multilayer semiconductor stack 302 and is separated from the active region 302a and a lower portion of the multilayer semiconductor stack 302 by an insulator. The side metal contact layer 318 may be formed, e.g., from a Cu layer with thin layer of Al that contacts sidewalls of the multilayer semiconductor stack 302.

The bottom portion of the multilayer semiconductor stack 302 is covered by a back metal mirror 304. The back metal mirror 304 reflects light, whether generated by the microLED or ambient impinging on the microLED. The back metal mirror 304 also provides electrical contact to the bottom portion of the multilayer semiconductor stack 302 and thus active region 302a. The back metal mirror 304 may be, for example, less than about 1 µm.

The bottom surface of the back metal mirror 304 may be covered with a backside oxide layer 308 of, for example, $SiO_2$. The backside oxide layer 308 may have a thickness of about 1 µm-about 2 µm, for example. The center of the backside oxide layer 308 may have a via formed therein in which a metal contact layer 306 is disposed. The metal contact layer 306 may be formed, for example, from Cu and contact the back metal mirror 304 to provide electrical contact to the bottom portion of the multilayer semiconductor stack 302. In some embodiments, the backside oxide layer 308 may be formed from a non-oxide based dielectric material.

A passivation layer 312 is formed on the bottom surface of the backside oxide layer 308, as well as on the bottom of the side oxide layer 316 and the side metal contact layer 318, which extend to the same plane. The passivation layer 312 may be formed from SiN or a similar material. The passivation layer 312 may be about 300 nm-about 500 nm. A bonding layer 314 of 600 nm-about 700 nm is formed on the bottom surface of the passivation layer 312. A via formed in a center of the passivation layer 312 and the bonding layer 314 to allow electrical contact to the bottom surface of the metal contact layer 306 by a contact layer 310 disposed in the via.

Similar to FIG. 3A, the microLED structure 300b shown in FIG. 3B contains a multilayer semiconductor stack 302 that contains an active region 302a and is surrounded laterally by a side oxide layer 316 and side metal contact layer 318, a backside oxide layer 308, a metal contact layer 306, a passivation layer 312, a bonding layer 314, and a contact layer 310. However, the back metal mirror 304 is not present in the embodiment shown in FIG. 3B. Instead, a multilayer reflective structure 330 is disposed on a bottom surface of the multilayer semiconductor stack 302, with an intervening a transparent conductive film 332 at the interface between the multilayer semiconductor stack 302 and the multilayer reflective structure 330. The transparent conductive film 332 may be indium tin oxide (ITO), for example. The transparent conductive film 332 permits current applied to one portion of the microLED structure 300b to spread laterally into the remainder of the pixel area.

The multilayer reflective structure 330 includes an e Via oxide layer 330b in which an eVia 330a is formed to provide electrical contact to the multilayer semiconductor stack 302. The eVia oxide layer 330b is essentially transparent to at least visible wavelengths, including the wavelength range emitted by the active region 302a. In other embodiments, materials other than an oxide may be used as long as such materials are essentially transparent to the visible wavelengths. The eVia 330a may be formed from Cu and plated with a contact layer such as AgTiW to contact the p doped region of the multilayer semiconductor stack 302 (e.g., GaN). Although not shown, a thin (e.g., about 20 nm) ITO layer may be disposed between the multilayer semiconductor stack 302 and oxide 330b. The oxide layer 330b may have a thickness of about 0.5 µm.

Figure 4:
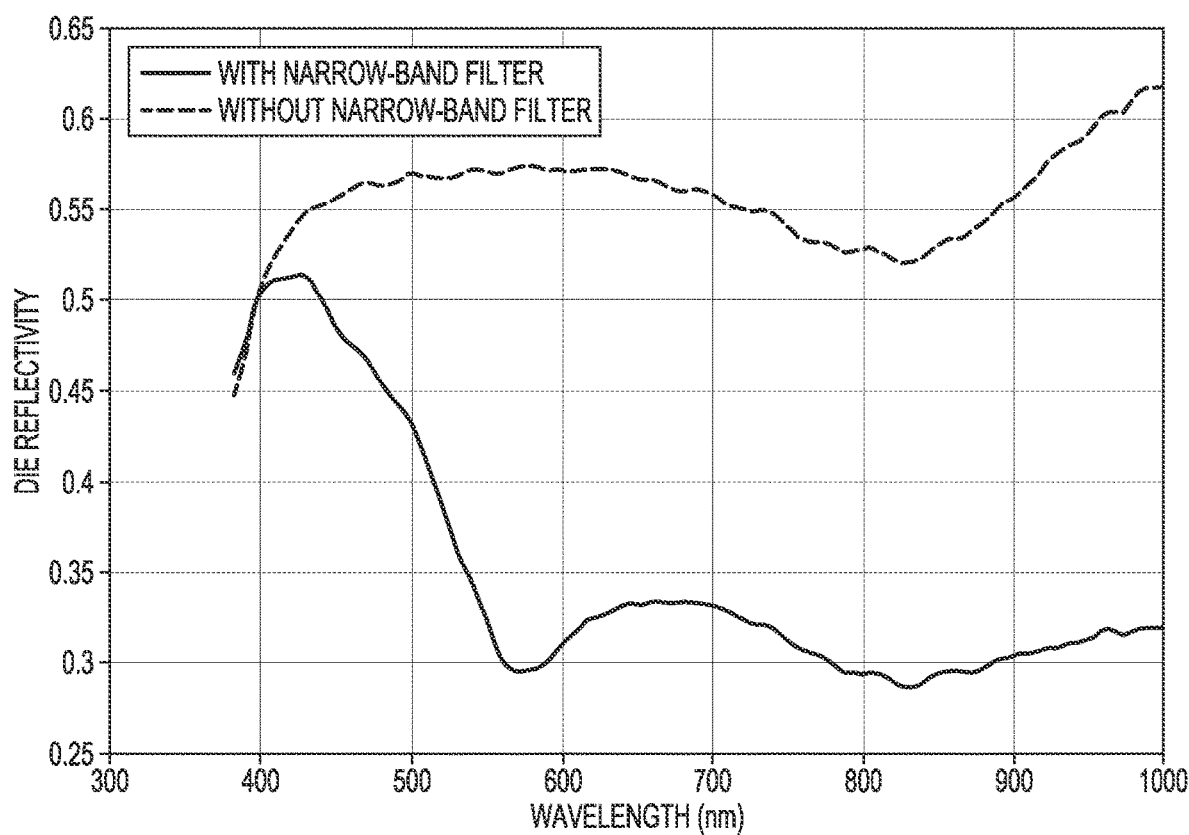
FIG. 4 illustrates die reflectivity for the structure shown in FIGS. 3A and 3B, according to some embodiments.

At a bottom surface of the eVia oxide layer 330b, a distributed Bragg reflector (DBR) structure 330c is disposed. The DBR structure 330c is a narrowband filter that reflects light within a narrow wavelength range (typically having a bandwidth of about 170 nm) and transmits the remaining light. In this case, the wavelength range reflected by the DBR structure 330c may be substantially centered around light emitted by the multilayer semiconductor stack 302 (which typically has a bandwidth of about 10-50 nm). The DBR structure 330c has a thickness of about 0.5 µm-about 1 µm. Although a DBR structure 330c is indicated, other Bragg reflectors or other narrowband reflectors may be used that have a relatively high degree of reflectivity at the wavelength range emitted by the active region 302a and significantly less reflectivity at visible wavelength ranges substantially outside the wavelength range emitted by the active region 302a. One such example is shown in FIG. 4, which is described in more detail below, in which the reflectivity in the wavelength range emitted by the active region 302a is about 50% higher than the reflectivity of visible light about 100 nm from the wavelength range emitted by the active region 302a.

An absorbing metal 330d is disposed on a lower surface of the DBR structure 330c. The absorbing metal 330d may be TiW, or other material that absorbs visible wavelengths at least outside the wavelength range reflected by the DBR structure 330c (and in some embodiments also within the wavelength range reflected by the DBR structure 330c). The absorbing metal 330d have a thickness of about 100 nm, for example. In other embodiments, materials other than a metal may be used to absorb visible wavelengths.

A microLED that contains the microLED structure 300b may as above emit light in a wavelength range defined by the active region 302a. Similarly, the DBR structure 330c of the microLED structure 300b is tailored to the wavelength range to be emitted. MicroLEDs are typically fabricated on a substrate and generally have the same emission characteristics. A microLED array may be used in a variety of devices, such as displays in mobile or other electronic devices, augmented or virtual reality devices, and other devices that use multicolor displays. As indicated, an extremely large number (hundreds of thousands to millions) of microLEDs with different emission characteristics may be used in the microLED array to form a single display. The emission characteristics may be perceptible as wholly different colors (e.g., red or blue) and within a perceptible color (e.g., red emitted at about 620 nm, 650 nm, 680 nm, etc. . . . ). The variation across colors and within each color may enable desired display characteristics of the overall display containing the microLED array. Accordingly, the microLED array contains microLEDs from multiple different substrates and that have different active regions 302a and DBR structures 330c that are arranged as desired to form the overall display.

In some embodiments, one or more anti-reflecting coatings may be applied to the microLED structure 300b shown in FIG. 3B. The anti-reflecting coating may be applied at one or more interfaces in FIG. 3B. In particular, the anti-reflecting coating may be deposited on a top surface of the encapsulant 320—i.e., at an interface between air and the encapsulant 320 above the multilayer semiconductor stack 302, on a top surface of the multilayer semiconductor stack 302—i.e., at an interface between the encapsulant 320 and the multilayer semiconductor stack 302, and/or at interface between the transparent conductive film 332 and the eVia oxide layer 330b. This use of an anti-reflecting coating at one or more of the interfaces described above may reduce or eliminate Fresnel reflections, and thus improve LED emission performance.

FIG. 4 illustrates die reflectivity for the structure shown in FIGS. 3A and 3B, according to some embodiments. In particular, the die reflectivity is taken at normal incidence in the simulation shown in FIG. 4. The narrowband reflector is a 3-pair DBR of 300 nm thickness employing $SiO_2$ and $Nb_2O_5$ layers. The microLED emits in the 440 nm range, which as shown is the location of the peak die reflectivity.

As will be appreciated by one skilled in the art, aspects, in particular aspects of micro-LED arrays and control of micro-LED arrays, described herein, may be embodied in various manners—e.g., as a method, a system, a computer program product, or a computer-readable storage medium. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module," or "system." Functions described in this disclosure may be implemented as an algorithm executed by one or more hardware processors, e.g., one or more microprocessors, of one or more computers. Although a processor is referred to herein, any logic capable of performing the functions indicated may be used. In various embodiments, different steps and portions of the steps of each of the methods described herein may be performed by different processors. Furthermore, aspects may take the form of a computer program product embodied in one or more computer-readable medium(s), such as a non-transitory medium, having computer-readable program code embodied, e.g., stored, thereon. In various embodiments, such a computer program may, for example, be downloaded (updated) to the existing devices and systems (e.g., to the existing lighting systems, etc.) or be stored upon manufacturing of these devices and systems. Further, upon reading and understanding the disclosed subject matter, a person of ordinary skill in the art will recognize that materials (e.g., dielectric materials, semiconductor materials, and metal materials, other than those explicitly recited, may be used in conjunction with or substituted for, the stated materials.

Figure 5:
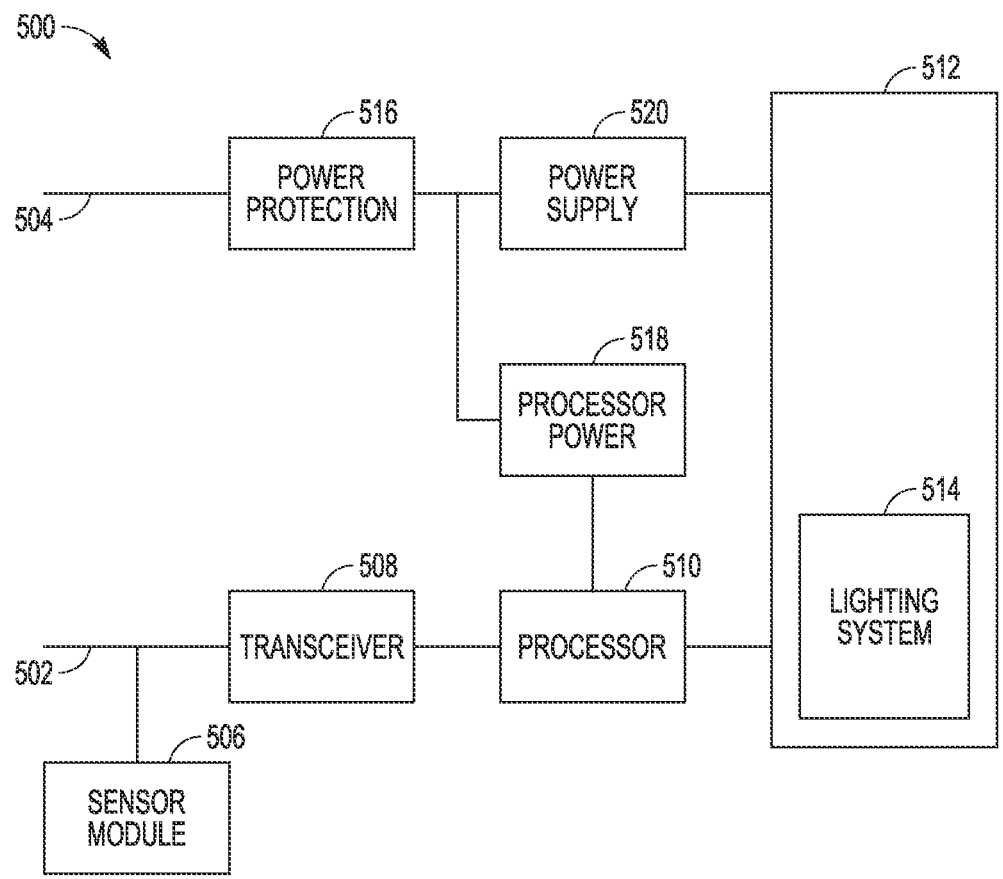
FIG. 5 illustrates an example lighting system, according to some embodiments.

FIG. 5 illustrates an example lighting system 500, according to some embodiments. In some of the embodiments, not all of the components shown in FIG. 5 may be present. The system 500 may be provided in any of the arrangements above, for example, in a luminaire, a mobile device, or for indoor or outdoor lighting environs. In some embodiments, the system 500 may also be used in an active headlamp system, or in an augmented reality or a virtual reality device. In any of these applications, the intensity of light and/or an image provided by the light output by the system 500 may be adjusted as described above. The system 500 may implement a pixelated configuration made possible by the microLED array.

The system 500 may be coupled to a bus 502 of the apparatus and a power source 504. The power source 504 may provide power for the system 500. The bus 502 may be coupled to one or more components that can provide data and/or utilize data provided to or from the system 500. The data provided on the bus 502 may include, for example, image data of an image to be displayed, user control data (e.g., brightness, contrast adjustments), data related to external system sensors, such as environmental conditions around the system 500 (such as a time of day, whether there is rain, whether there is fog, ambient light levels, and other environmental data), among others. When the system 500 is in a vehicle and the lighting is provided for internal cabin lighting or display, for example, the data provided on the bus 502 may also be related to conditions of the vehicle (such as whether the vehicle is parked, whether the vehicle is in motion, a current speed of the vehicle, a current direction of travel of the vehicle), and/or presence/positions of other vehicles or pedestrians around the vehicle. The system 500 may provide feedback (such as information regarding operation of the system) to the components shown or other components of the device in which the system 500 resides.

The system 500 may further comprise a sensor module 506. In some embodiments, the sensor module 506 may include one or more sensors that can sense surroundings of the system 500. For example, the one or more sensors may sense surroundings that can affect an image to be produced by light emitted by the system 500. In embodiments in which the system 500 is disposed in a vehicle for example, the sensors may sense environmental conditions around the vehicle, and/or presence/positions of other vehicles or pedestrians around the vehicle if not already provided. In other embodiments, such as when the system 500 is disposed in a mobile device, the sensor module 506 may include one or more of an accelerometer, gyroscope, magnetometer, GPS, proximity sensor, ambient light sensor, microphone, touchscreen sensor, among others. The sensor module 506 may operate in combination with the data provided on the bus 502 or may operate in lieu of a portion of the data being provided on the bus 502. The sensor module 506 may output visually (and/or audibly and/or tactilely) data indicating that has been sensed by the sensors.

The system 500 may further include a transceiver 508. The transceiver 508 may have a universal asynchronous receiver-transmitter (UART) interface or a serial peripheral interface (SPI) in some embodiments. The transceiver 508 may also be coupled to the bus 502 and the sensor module 506, and may receive data from the bus 502 and the sensor module 506. In some embodiments, the transceiver 508 may multiplex the data received from the bus 502 and the sensor module 506. The transceiver 508 may direct feedback to the bus 502 or the sensor module 506.

The system 500 may further include a processor 510. The processor 510 may be a hardware processor (single or multiple core) that is coupled to the transceiver 508. The processor 510 may exchange data with the transceiver 508. For example, the processor 510 may receive data from the transceiver 508 that was provided by the bus 502 and/or the sensor module 506. The processor 510 may generate image data that indicates an image to be produced by light emitted from the system 500. The processor 510 may further generate one or more inquiries that request information from one or more of the components (shown or not shown) of the system 500. The processor 510 may further provide the feedback to the transceiver 508 to be directed to the bus 502 and/or the sensor module 506.

The system 500 may further include an illumination device 512. The illumination device 512 may produce multiple different outputs of light. The illumination device 512 may include a lighting system 514 that contains a micro-LED array (which, as above, may be several tens of thousands or more individual micro-LEDs). The illumination device 512 may be coupled to the processor 510 and may exchange data (such as intensity or temperature feedback) with the processor 510. In particular, the lighting system 514 may be coupled to the processor 510 and may exchange data with the processor 510. The lighting system 514 may receive the image data and inquiries from processor 510 and may provide feedback to the processor 510.

The system 500 may further include power protection 516. The power protection 516 may be coupled to the power source 504 and may receive power from the power source. The power protection 516 may include one or more filters that may reduce conducted emissions and provide power immunity. In some embodiments, the power protection 516 may provide electrostatic discharge (ESD) protection, load-dump protection, alternator field decay protection, reverse polarity protection, or some combination thereof.

The system 500 may further include processor power 518. The processor power 518 may be coupled to the power protection 516 and may receive power from the power source 504. The processor power 518 may comprise, for example, a low-dropout (LDO) regulator that may generate power for powering the processor 510 from the power provided by the power source 504. The processor power 518 may further be coupled to the processor 510 and may provide power to the processor 510.

The system 500 may further comprise a power supply 520. The power supply 520 may be coupled to the power protection 516 and may receive power from the power source 504. In some embodiments, the power supply 520 may comprise a converter that converts the power from the power source 504 to power for the illumination device 512. For example, the power supply 520 may comprise a direct current (DC)-to-DC converter that converts the power from the power supply 520 from a first voltage to a second voltage for the lighting system 514 of the illumination device 512.

Figure 6:
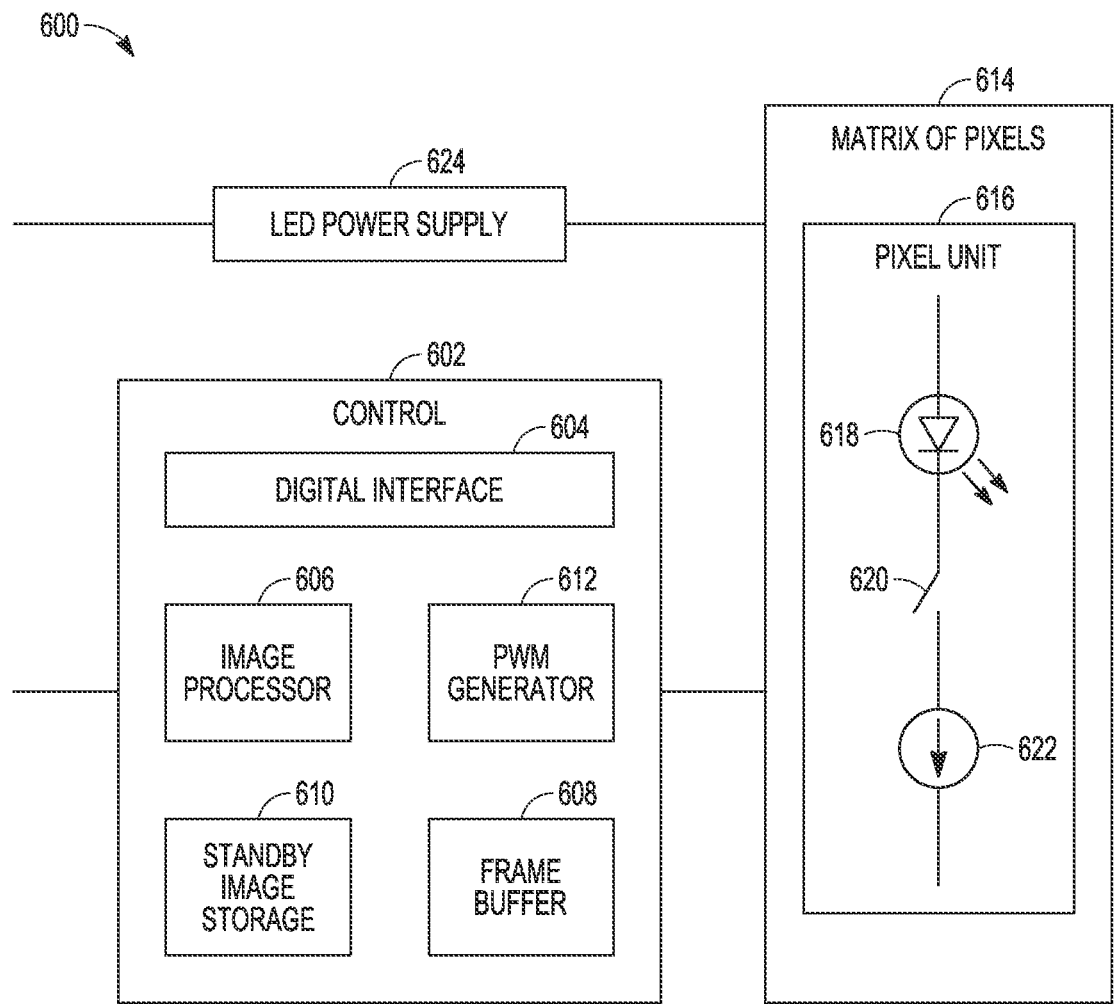
FIG. 6 illustrates an example lighting system, according to some embodiments.

FIG. 6 illustrates an example lighting system 600, according to some embodiments. As above, some of the elements shown in the lighting system 600 may not be present, while other additional elements may be disposed in the lighting system 600. The system 500 shown in FIG. 5 may include one or more of the features of the lighting system 600. The lighting system 600 may include a control module 602. In some embodiments, some or all of the components described as the control module 602 may be disposed on, for example, a compound metal oxide semiconductor (CMOS) backplane. The control module 602 may be coupled to or include the processor 510 of the overall system 500 shown in FIG. 5. The control module 602 may receive image data and inquiries from the processor 510. The control module 602 may further provide feedback to the processor 510.

The control module 602 may include a digital interface 604. The digital interface 604 may facilitate communication with the processor and other components within the lighting system 600. For example, the digital interface 604 may comprise an SPI interface in some embodiments, where the SPI interface may facilitate communication.

The control module 602 may further include an image processor 606. The image processor 606 may be a dedicated processor that is different from, or may be the same as, the processor 510 shown in FIG. 5. The image processor 606 may receive the image data via the digital interface 604 and may process the image data to produce indications of, for example, PWM duty cycles and/or intensities of light for causing the lighting system 600 to produce the images indicated by the image data based on the calibration described above.

The control module 602 may further include a frame buffer 608 and a standby image storage 610. The frame buffer 608 may receive the indications produced by the image processor 606 and store the indications for implementation. The standby image storage 610 may further store indications of PWM duty cycles, intensities of light, and/or turn-on times. The indications stored in the standby image storage 610 may be implemented in the absence of indications stored in the frame buffer 608. For example, the frame buffer 608 may retrieve the indications from the standby image storage 610 when the frame buffer 608 is empty.

The control module 602 may further include a PWM generator 612. The PWM generator 612 may receive the indications from the frame buffer 608 and may produce PWM signals in accordance with the indications. The PWM generator 612 may further determine intensities of light based on the indications and produce a signal to cause the intensities of light to be produced.

The lighting system 600 may include a micro-LED array 614. The micro-LED array 614 may include a plurality of pixels, where each of the pixels includes a pixel unit 616 that may be controlled individually or in groups of pixel units 616. In particular, the pixel unit 616 may include an LED 618, a PWM switch 620, and a current source 622. The pixel unit 616 may receive the signals from the PWM generator 612. The PWM signal from the PWM generator 612 may cause the PWM switch 620 to open and close in accordance with the value of the PWM signal. The signal corresponding to the intensities of light may cause the current source 622 to produce a current flow to cause the LED 618 to produce the corresponding intensities of light.

The lighting system 600 may further include an LED power supply 624. In some embodiments, the LED power supply 624 may be a separate power supply that is coupled to the power supply 520 (see FIG. 5) and may receive power from the power supply 520. The LED power supply 624 may produce power for the LEDs of the micro-LED array 614. The LED power supply 624 may be coupled to the micro-LED array 614 and may provide the power for the LEDs to the micro-LED array 614.

Figure 7:
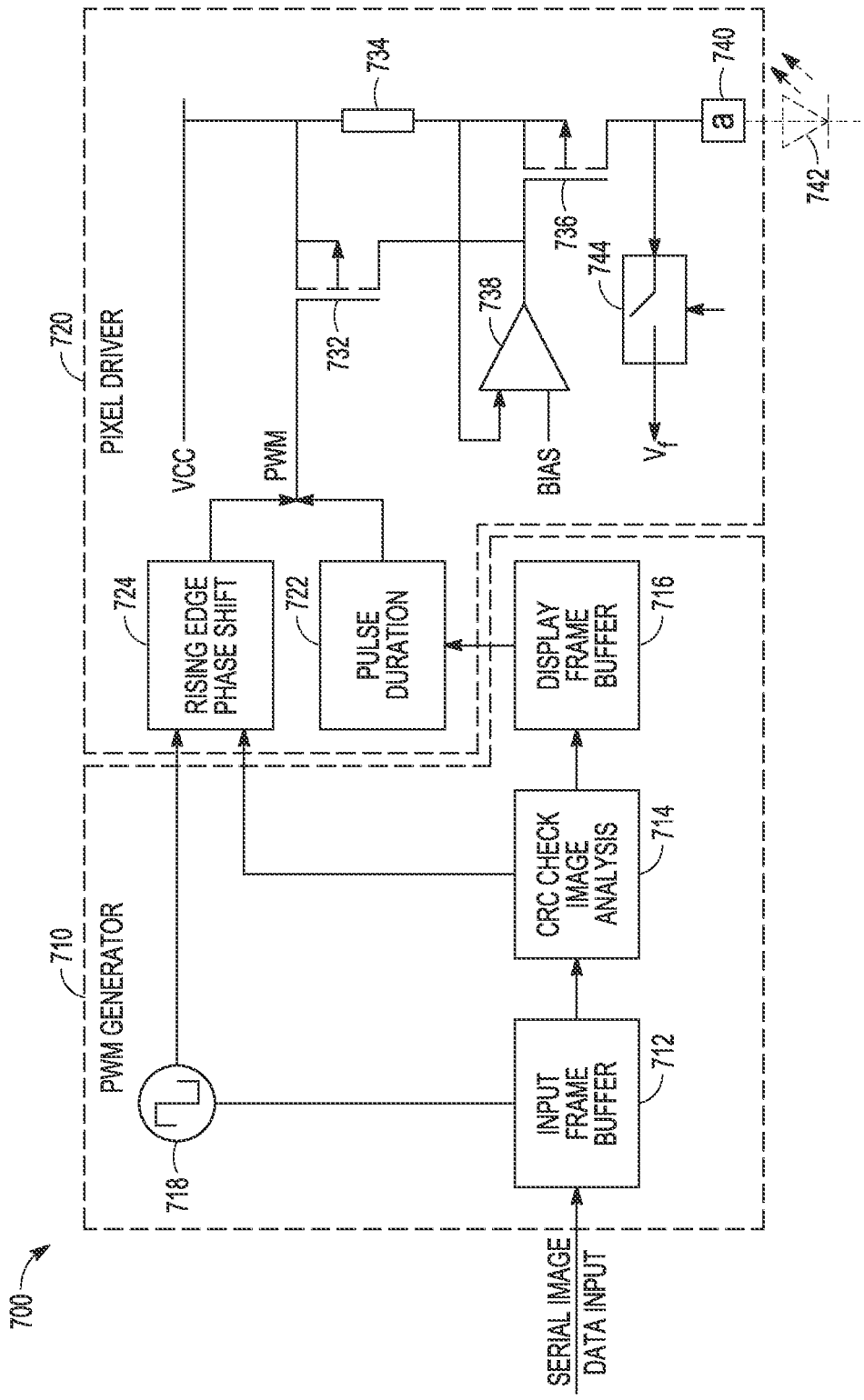
FIG. 7 illustrates an example hardware arrangement for implementing the lighting system of FIG. 6, according to some embodiments.

FIG. 7 illustrates an example hardware arrangement for implementing the system of FIG. 6, according to some embodiments. As above, only one embodiment of the hardware arrangement is shown; in other embodiments, some of the elements may not be present or other elements may be added. In particular, the hardware arrangement 700 of FIG. 7 shows further specifics of the control module 602 and the micro-LED array 614 of the lighting system 600 as described above. Note that not all elements may be shown, such as the processor and memories used to provide the functionality of the various modules shown in FIG. 7. In some embodiments, the circuitry shown in FIG. 7 may be provided on, for example, a CMOS backplane.

The control module 710 may be supplied with data to control the LEDs 742. In particular, the control module 710 contains an input frame buffer 712 having an input to which serial image data to be provided for display may be received via the digital interface. The serial image data may include indications produced by the image processor (not shown). The input frame buffer 712 may retrieve the indications from the standby image storage when the input frame buffer 712 is empty for use to display. The input frame buffer 712 may provide the serial image data to a cyclic redundancy check (CRC) image analysis module 714 of the processor, which may determine whether the serial image data buffered is valid. If so, the valid data may be supplied to a display frame buffer 716.

Data from the CRC image analysis module 714 and the display frame buffer 716 may be supplied to the pixel driver 720 to drive the LEDs 742. In particular, the data from the CRC image analysis module 714 may be supplied to a rising edge phase shift module 724 of the pixel driver 720 while data from the display frame buffer 716 may be supplied to a pulse duration module 722 of the pixel driver 720. The rising edge phase shift module 724 may also receive a PWM of a predetermined frequency from a PWM generator 718. Thus, the CRC image analysis module 714 data may be used by the rising edge phase shift module 724 to determine how much to shift the rising edge of the PWM signal, while the data from the display frame buffer 716 may be used to adjust the duration of the resulting PWM signal.

The resulting phase-shifted and duration-adjusted PWM signal may be supplied to a control terminal of an input transconductance device 732. As shown the input transconductance device 732 may be a p-channel enhancement type MOSFET, although other types of FETs or other devices may be used. Thus, the altered PWM signal may be supplied to the gate of the MOSFET 732. The source of the MOSFET 732 may be connected with the power supply Vcc. The drain of the MOSFET 732 may be connected with an output of a comparator 738 and with the control terminal of another MOSFET 736. The inputs of the comparator 738 may be a predetermined bias voltage and a voltage that is dependent on the altered PWM signal. The source of the MOSFET 732 (and thus PWM signal) is coupled to one end of a resistor 734 and the other end of the resistor 734 may be coupled to another input of the comparator 738 and the source of the other MOSFET 736. The drain of the other MOSFET 736 may be coupled to an amplifier 740 before being supplied to the LEDs 742. The drain of the other MOSFET 736 may also be coupled to a switch 744 to supply a feedback voltage to the control module 710.

Figure 8:
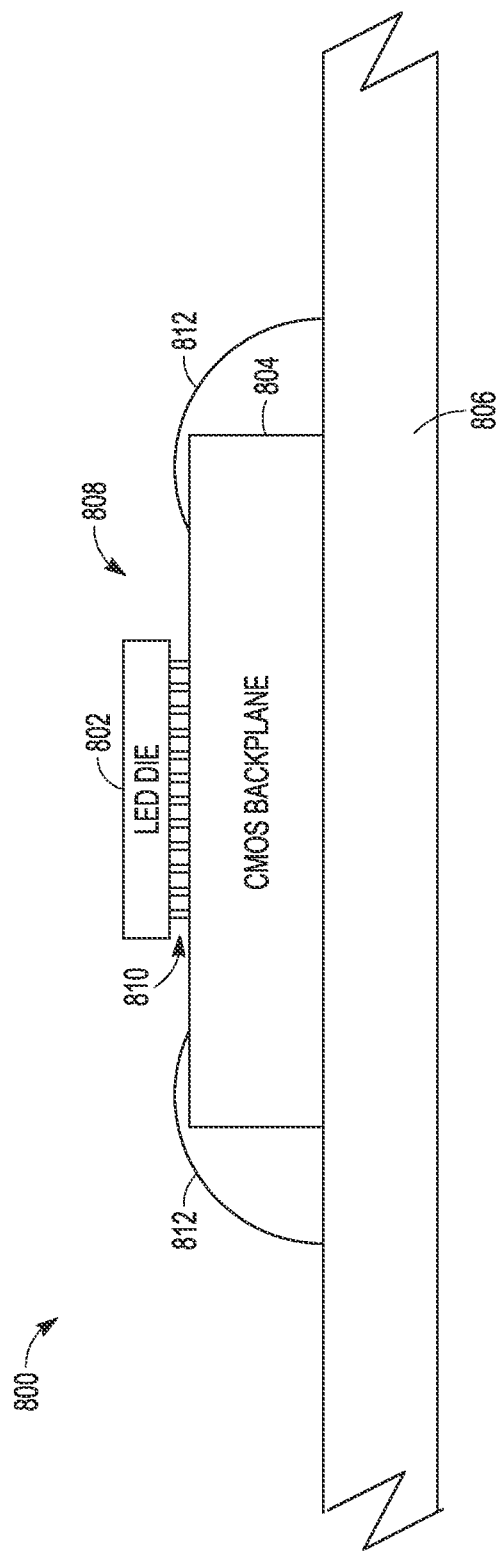
FIG. 8 illustrates an example hardware arrangement for implementing the systems herein, according to some embodiments.

FIG. 8 illustrates an example hardware arrangement 800 for implementing the above disclosed subject matter, according to some embodiments. In particular, the hardware arrangement 800 may illustrate hardware components that may implement the system 500. The hardware arrangement 800 may include an integrated LED 808. The integrated LED 808 may include an LED die 802 and a CMOS backplane 804. The LED die 802 may be coupled to the CMOS backplane 804 by one or more interconnects 810, where the interconnects 810 may provide for transmission of signals between the LED die 802 and the CMOS backplane 804. The interconnects 810 may comprise one or more solder bump joints, one or more copper pillar bump joints, other types of interconnects known in the art, or some combination thereof.

The LED die 802 may include circuitry to implement the micro-LED array. In particular, the LED die 802 may include a plurality of micro-LEDs. The LED die 802 may include a shared active layer and a shared substrate for the micro-LED array, and thereby the micro-LED array may be a monolithic micro-LED array. Each micro-LED of the micro-LED array may include an individual segmented active layer and/or substrate. In some embodiments, the LED die 802 may further include switches and current sources to drive the micro-LED array. In other embodiments, the PWM switches and the current sources may be included in the CMOS backplane 804.

The CMOS backplane 804 may include circuitry to implement the control module and/or the LED power supply. The CMOS backplane 804 may utilize the interconnects 810 to provide the micro-LED array with the PWM signals and the signals for the intensity for causing the micro-LED array to produce light in accordance with the PWM signals and the intensity. Because of the relatively large number and density of connections to drive the micro-LED array compared to standard LED arrays, different embodiments may be used to electrically connect the CMOS backplane 804 and the LED die 802. Either the bonding pad pitch of the CMOS backplane 804 may be the same as the pitch of bonding pads in the micro-LED array, or the bonding pad pitch of the CMOS backplane 804 may be larger than the pitch of bonding pads in the micro-LED array.

The hardware arrangement 800 may further include a PCB 806. The PCB 806 may include circuitry to implement functionality such as that shown in, for example, FIG. 5 (the power protection 516, the processor power 518, the sensor module 506, the transceiver 508, the processor 510, or portions thereof). The PCB 806 may be coupled to the CMOS backplane 804. For example, the PCB 806 may be coupled to the CMOS backplane 804 via one or more wire bonds 812. The PCB 806 and the CMOS backplane 804 may exchange image data, power, and/or feedback via the coupling, among other signals.

As shown, the micro-LEDs and circuitry supporting the micro-LED array can be packaged and include a submount or printed circuit board for powering and controlling light production by the micro-LEDs. The PCB 806 supporting the micro-LED array may include electrical vias, heat sinks, ground planes, electrical traces, and flip chip or other mounting systems. The submount or PCB may be formed of any suitable material, such as ceramic, silicon, aluminum, etc. If the submount material is conductive, an insulating layer may be formed over the substrate material, and a metal electrode pattern formed over the insulating layer for contact with the micro-LED array. The submount can act as a mechanical support, providing an electrical interface between electrodes on the micro-LED array and a power supply, and also provide heat sink functionality.

As above, a variety of applications may be supported by micro-LED arrays. Such applications may include a stand-alone applications to provide general illumination (e.g., within a room or vehicle) or to provide specific images. In addition to devices such as a luminaire, projector, mobile device, the system may be used to provide either augmented reality (AR) and virtual reality (VR)-based applications. Visualization systems, such as VR and AR systems, are becoming increasingly more common across numerous fields such as entertainment, education, medicine, and business. Various types of devices may be used to provide AR/VR to users, including headsets, glasses, and projectors. Such an AR/VR system may include components similar to those described above: the micro-LED array, a display or screen (which may include touchscreen elements), a micro-LED array controller, sensors, and a controller, among others. The AR/VR components can be disposed in a single structure, or one or more of the components shown can be mounted separately and connected via wired or wireless communication. Power and user data may be provided to the controller. The user data input can include information provided by audio instructions, haptic feedback, eye or pupil positioning, or connected keyboard, mouse, or game controller. The sensors may include cameras, depth sensors, audio sensors, accelerometers, two or three axis gyroscopes and other types of motion and/or environmental/wearer sensors that provide the user input data. Other sensors can include but are not limited to air pressure, stress sensors, temperature sensors, or any other suitable sensors for local or remote environmental monitoring. In some embodiments, the control input can include detected touch or taps, gestural input, or control based on headset or display position. As another example, based on the one or more measurement signals from one or more gyroscope or position sensors that measure translation or rotational movement, an estimated position of the AR/VR system relative to an initial position can be determined.

In some embodiments, the controller may control individual micro-LEDs or one or more micro-LED pixels (groups of micro-LEDs) to display content (AR/VR and/or non-AR/VR) to the user while controlling other micro-LEDs and sensors used in eye tracking to adjust the content displayed. Content display micro-LEDs may be designed to emit light within the visible band (approximately 400 nm to 780 nm) while micro-LEDs used for tracking may be designed to emit light in the IR band (approximately 780 nm to 2,200 nm). In some embodiments, the tracking micro-LEDs and content micro-LEDs may be simultaneously active. In some embodiments, the tracking micro-LEDs may be controlled to emit tracking light during a time period that content micro-LEDs are deactivated and are thus not displaying content to the user. The AR/VR system can incorporate optics, such as those described above, and/or an AR/VR display, for example to couple light emitted by micro-LED array onto the AR/VR display.

In some embodiments, the AR/VR controller may use data from the sensors to integrate measurement signals received from the accelerometers over time to estimate a velocity vector and integrate the velocity vector over time to determine an estimated position of a reference point for the AR/VR system. In other embodiments, the reference point used to describe the position of the AR/VR system can be based on depth sensor, camera positioning views, or optical field flow. Based on changes in position, orientation, or movement of the AR/VR system, the system controller can send images or instructions the light emitting array controller. Changes or modification the images or instructions can also be made by user data input, or automated data input.

In general, in a VR system, a display can present to a user a view of scene, such as a three-dimensional scene. The user can move within the scene, such as by repositioning the user's head or by walking. The VR system can detect the user's movement and alter the view of the scene to account for the movement. For example, as a user rotates the user's head, the system can present views of the scene that vary in view directions to match the user's gaze. In this manner, the VR system can simulate a user's presence in the three-dimensional scene. Further, a VR system can receive tactile sensory input, such as from wearable position sensors, and can optionally provide tactile feedback to the user.

In an AR system, on the other hand, the display can incorporate elements from the user's surroundings into the view of the scene. For example, the AR system can add textual captions and/or visual elements to a view of the user's surroundings. For example, a retailer can use an AR system to show a user what a piece of furniture would look like in a room of the user's home, by incorporating a visualization of the piece of furniture over a captured image of the user's surroundings. As the user moves around the user's room, the visualization accounts for the user's motion and alters the visualization of the furniture in a manner consistent with the motion. For example, the AR system can position a virtual chair in a room. The user can stand in the room on a front side of the virtual chair location to view the front side of the chair. The user can move in the room to an area behind the virtual chair location to view a back side of the chair. In this manner, the AR system can add elements to a dynamic view of the user's surroundings.

Figure 9:
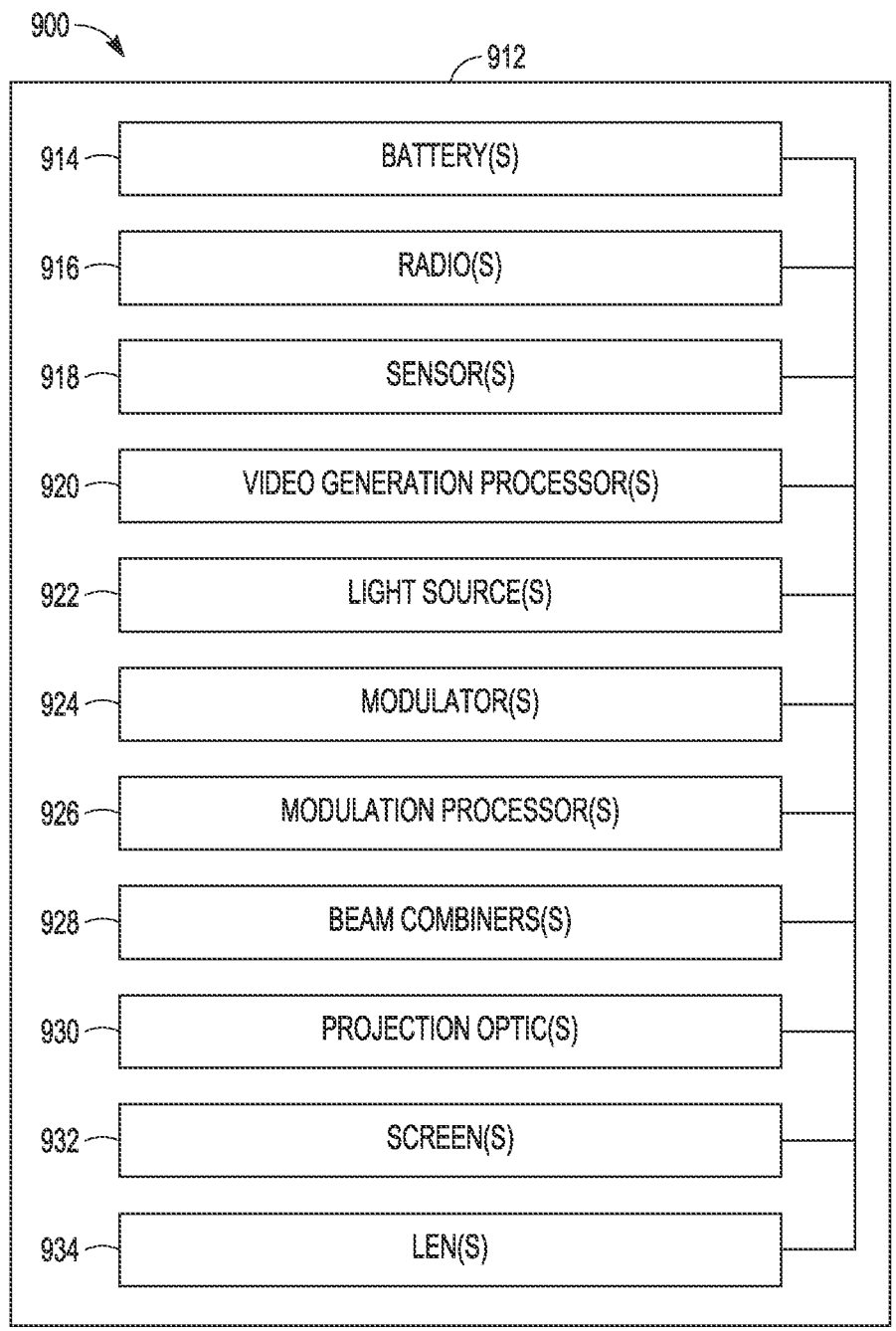
FIG. 9 shows a block diagram of an example of a visualization system, according to some embodiments.

FIG. 9 shows a block diagram of an example of a visualization system, according to some embodiments. The visualization system 910 can include a wearable housing 912, such as a headset or goggles. The housing 912 can mechanically support and house the elements detailed below. In some examples, one or more of the elements detailed below can be included in one or more additional housings that can be separate from the wearable housing 912 and couplable to the wearable housing 912 wirelessly and/or via a wired connection. For example, a separate housing can reduce the weight of wearable goggles, such as by including batteries, radios, and other elements. The housing 912 can include one or more batteries 914, which can electrically power any or all of the elements detailed below. The housing 912 can include circuitry that can electrically couple to an external power supply, such as a wall outlet, to recharge the batteries 914. The housing 912 can include one or more radios 916 to communicate wirelessly with a server or network via a suitable protocol, such as WiFi.

The visualization system 910 can include one or more sensors 918, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 918 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an AR system, one or more of the sensors 918 can capture a real-time video image of the surroundings proximate a user.

The visualization system 910 can include one or more video generation processors 920. The one or more video generation processors 920 can receive scene data that represents a three-dimensional scene, such as a set of position coordinates for objects in the scene or a depth map of the scene. This data may be received from a server and/or a storage medium. The one or more video generation processors 920 can receive one or more sensor signals from the one or more sensors 918. In response to the scene data, which represents the surroundings, and at least one sensor signal, which represents the location and/or orientation of the user with respect to the surroundings, the one or more video generation processors 920 can generate at least one video signal that corresponds to a view of the scene. In some examples, the one or more video generation processors 920 can generate two video signals, one for each eye of the user, that represent a view of the scene from a point of view of the left eye and the right eye of the user, respectively. In some examples, the one or more video generation processors 920 can generate more than two video signals and combine the video signals to provide one video signal for both eyes, two video signals for the two eyes, or other combinations.

The visualization system 910 can include one or more light sources 922 that can provide light for a display of the visualization system 910. Suitable light sources 922 can include a light-emitting diode, a monolithic light-emitting diode, a plurality of light-emitting diodes, an array of light-emitting diodes, an array of light-emitting diodes disposed on a common substrate, a segmented light-emitting diode that is disposed on a single substrate and has light-emitting diode elements that are individually addressable and controllable (and/or controllable in groups and/or subsets), an array of micro-light-emitting diodes (microLEDs), and others.

A light-emitting diode can be white-light light-emitting diode. For example, a white-light light-emitting diode can emit excitation light, such as blue light or violet light. The white-light light-emitting diode can include one or more phosphors that can absorb some or all of the excitation light and can, in response, emit phosphor light, such as yellow light, that has a wavelength greater than a wavelength of the excitation light.

The one or more light sources 922 can include light-producing elements having different colors or wavelengths. For example, a light source can include a red light-emitting diode that can emit red light, a green light-emitting diode that can emit green light, and a blue light-emitting diode that can emit blue right. The red, green, and blue light combine in specified ratios to produce any suitable color that is visually perceptible in a visible portion of the electromagnetic spectrum.

The visualization system 910 can include one or more modulators 924. The modulators 924 can be implemented in one of at least two configurations.

In a first configuration, the modulators 924 can include circuitry that can modulate the light sources 922 directly. For example, the light sources 922 can include an array of light-emitting diodes, and the modulators 924 can directly modulate the electrical power, electrical voltage, and/or electrical current directed to each light-emitting diode in the array to form modulated light. The modulation can be performed in an analog manner and/or a digital manner. In some examples, the light sources 922 can include an array of red light-emitting diodes, an array of green light-emitting diodes, and an array of blue light-emitting diodes, and the modulators 924 can directly modulate the red light-emitting diodes, the green light-emitting diodes, and the blue light-emitting diodes to form the modulated light to produce a specified image.

In a second configuration, the modulators 924 can include a modulation panel, such as a liquid crystal panel. The light sources 922 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 924 can include multiple modulation panels that can modulate different colors of light. For example, the modulators 924 can include a red modulation panel that can attenuate red light from a red light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 924 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 910 can include one or more modulation processors 926, which can receive a video signal, such as from the one or more video generation processors 920, and, in response, can produce an electrical modulation signal. For configurations in which the modulators 924 directly modulate the light sources 922, the electrical modulation signal can drive the light sources 924. For configurations in which the modulators 924 include a modulation panel, the electrical modulation signal can drive the modulation panel.

The visualization system 910 can include one or more beam combiners 928 (also known as beam splitters 928), which can combine light beams of different colors to form a single multi-color beam. For configurations in which the light sources 922 can include multiple light-emitting diodes of different colors, the visualization system 910 can include one or more wavelength-sensitive (e.g., dichroic) beam splitters 928 that can combine the light of different colors to form a single multi-color beam.

The visualization system 910 can direct the modulated light toward the eyes of the viewer in one of at least two configurations. In a first configuration, the visualization system 910 can function as a projector, and can include suitable projection optics 930 that can project the modulated light onto one or more screens 932. The screens 932 can be located a suitable distance from an eye of the user. The visualization system 910 can optionally include one or more lenses 934 that can locate a virtual image of a screen 932 at a suitable distance from the eye, such as a close-focus distance, such as 500 mm, 750 mm, or another suitable distance. In some examples, the visualization system 910 can include a single screen 932, such that the modulated light can be directed toward both eyes of the user. In some examples, the visualization system 910 can include two screens 932, such that the modulated light from each screen 932 can be directed toward a respective eye of the user. In some examples, the visualization system 910 can include more than two screens 932. In a second configuration, the visualization system 910 can direct the modulated light directly into one or both eyes of a viewer. For example, the projection optics 930 can form an image on a retina of an eye of the user, or an image on each retina of the two eyes of the user.

For some configurations of AR systems, the visualization system 910 can include at least a partially transparent display, such that a user can view the user's surroundings through the display. For such configurations, the AR system can produce modulated light that corresponds to the augmentation of the surroundings, rather than the surroundings itself. For example, in the example of a retailer showing a chair, the AR system can direct modulated light, corresponding to the chair but not the rest of the room, toward a screen or toward an eye of a user.

Figure 10:
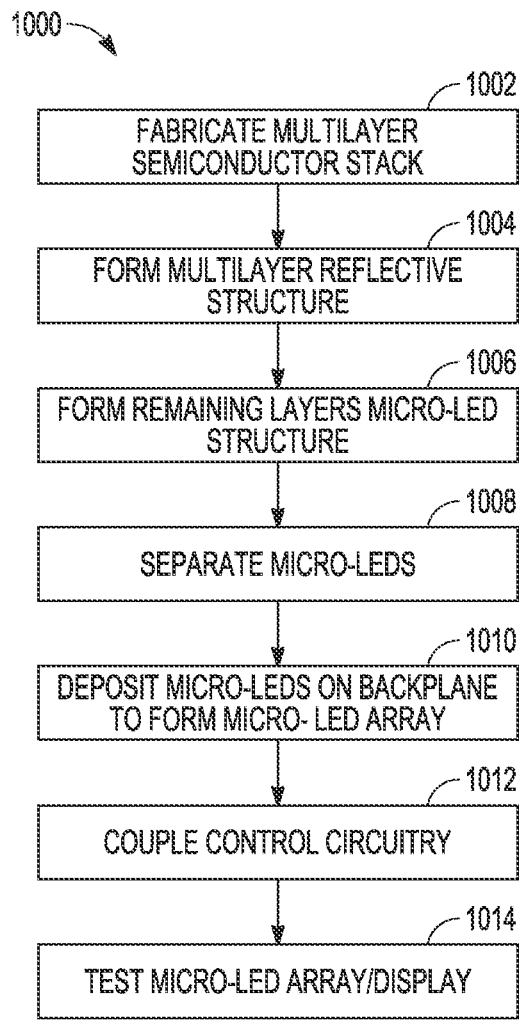
FIG. 10 illustrates an example method of fabricating a micro-LED array, according to some embodiments.

FIG. 10 illustrates an example method of fabricating a micro-LED array, according to some embodiments. Not all of the operations may be undertaken in the method 1000 of FIG. 10, and/or additional operations may be present. The method 1000 is separated into stages that may be undertaken by different entities.

At operation 1002, the multilayer semiconductor stack may be fabricated on a Sapphire or other substrate. The multilayer semiconductor stack may be used to provide a large number of microLEDs. For a GaN-based multilayer semiconductor stack, hydride vapor phase epitaxy (HVPE) may be used, for example. For other compound semiconductors, Metalorganic vapor-phase epitaxy (MOCVD) or Molecular beam epitaxy (MBE), for example, may be used to fabricate the multilayer semiconductor stack.

After fabrication of the multilayer semiconductor stack, the wafer may be moved a different location to form the multilayer reflective structure at operation 1004. To form the multilayer reflective structure, each layer may be sequentially deposited (including the DBR layers to form a DBR structure having a specific reflective center) using deposition processes tailored for the individual layers, a via is formed the layer structure using photolithographic processes, and the eVia deposited in the via before stripping the photoresist. Overall, the multilayer reflective structure is thicker than the back metal mirror.

The remaining contact and other layers of the microLED structure are then formed on the wafer at operation 1006. That is, the sidewall oxide and contact layers shown in FIG. 3B may be deposited or otherwise formed on the underlying structure.

The microLEDs of the wafer are then separated at operation 1008 and different microLEDs are combined into a microLED array at operation 1010. The different microLEDs are from different wafers and configured to emit at different visible wavelengths. The different visible wavelengths may be within a particular color or in different colors, dependent on the desired emission characteristics of the microLED array/display.

Control circuitry is then coupled to the microLED array at operation 1012. The control circuitry is used to control the individual microLEDs of the microLED array.

The microLED array/display may be tested at operation 1014. The testing may use the control circuitry to determine the emission characteristics of the microLED array/display.

EXAMPLES

Example 1 is a micro-light-emitting diode (LED) comprising: a semiconductor structure containing an active region configured to emit light of a predetermined visible wavelength range; and a multilayer reflector structure that includes, a narrowband reflector configured to have a maximum reflectance at the predetermined visible wavelength range and to reflect the light emitted by the active region towards an emission surface of the semiconductor structure.

In Example 2, the subject matter of Example 1 includes, wherein the multilayer reflector structure is disposed on a surface of the semiconductor structure opposing the emission surface.

In Example 3, the subject matter of Example 2 includes, wherein the multilayer reflector structure further comprises a protective layer disposed between the narrowband filter and the semiconductor structure, the protective layer substantially transparent to light of visible wavelengths.

In Example 4, the subject matter of Example 3 includes, wherein the protective layer comprises silicon dioxide.

In Example 5, the subject matter of Examples 3-4 includes, wherein the multilayer reflector structure further comprises an absorbing layer configured to absorb the light of visible wavelengths, the narrowband filter disposed between the absorbing layer and the semiconductor structure.

In Example 6, the subject matter of Example 5 includes, wherein the absorbing layer comprises TiW.

In Example 7, the subject matter of Examples 3-6 includes, a transparent conductive film disposed between the protective layer and the semiconductor structure, the transparent conductive film disposed on the semiconductor structure.

In Example 8, the subject matter of Example 7 includes, an anti-reflecting coating disposed at an interface between transparent conductive film and the protective layer.

In Example 9, the subject matter of Examples 1-8 includes, an encapsulant that encapsulates the semiconductor structure and the multilayer reflector structure, the encapsulant transparent to visible light; and an anti-reflecting coating disposed at an interface between the encapsulant and air.

In Example 10, the subject matter of Examples 1-9 includes, an encapsulant that encapsulates the semiconductor structure and the multilayer reflector structure, the encapsulant transparent to visible light; and an anti-reflecting coating disposed at an interface between the encapsulant and the semiconductor structure.

In Example 11, the subject matter of Examples 1-10 includes, wherein the narrowband filter comprises a distributed Bragg reflector (DBR).

In Example 12, the subject matter of Examples 1-11 includes, an eVia comprising a conductive material configured to electrically contact the semiconductor structure, the multilayer reflector structure laterally surrounding the e Via.

In Example 13, the subject matter of Example 12 includes, wherein: the conductive material comprises Cu plated with AgTiW to contact a p doped region of the semiconductor structure, and a Cu layer with thin layer of Al contacts sidewalls of an n doped region of the semiconductor structure.

In Example 14, the subject matter of Examples 1-13 includes, wherein the active region comprises a multiquantum well structure.

Example 15 is a micro-light-emitting diode (LED) system comprising: a plurality of micro-LEDs configured to emit light of different wavelength ranges, each micro-LED comprising: a semiconductor structure containing an active region configured to emit light of a predetermined visible wavelength range; and a multilayer reflector structure that includes, a distributed Bragg reflector (DBR) configured to have a maximum reflectance at the predetermined visible wavelength range and to reflect the light emitted by the active region towards an emission surface of the semiconductor structure; and control circuitry configured to individually drive each of the micro-LEDs.

In Example 16, the subject matter of Example 15 includes, wherein the multilayer reflector structure is disposed on a surface of the semiconductor structure opposing the emission surface.

In Example 17, the subject matter of Example 16 includes, wherein the multilayer reflector structure further comprises a protective layer disposed between the DBR and the semiconductor structure, the protective layer substantially transparent to light of visible wavelengths.

In Example 18, the subject matter of Example 17 includes, wherein the multilayer reflector structure further comprises an absorbing layer configured to absorb the light of visible wavelengths, the DBR disposed between the absorbing layer and the semiconductor structure.

In Example 19, the subject matter of Examples 15-18 includes, wherein: each micro-LED further comprises an eVia comprising a conductive material configured to electrically contact the semiconductor structure, the multilayer reflector structure of the micro-LED laterally surrounds the eVia, and the control circuitry is configured to control activation of the micro-LED through the eVia.

Example 20 is a method of fabricating a micro-light-emitting diode (LED) array including a plurality of micro-LEDs, the method comprising, for each micro-LED: providing a semiconductor structure of the micro-LED, the semiconductor structure containing an active region configured to emit light of a predetermined visible wavelength range; and fabricating a multilayer reflector structure on the semiconductor structure, the multilayer reflector structure comprising a narrowband reflector configured to have a maximum reflectance at the predetermined visible wavelength range and to reflect the light emitted by the active region towards an emission surface of the semiconductor structure.

In Example 21, the subject matter of Example 20 includes, wherein fabricating the multilayer reflector structure comprises depositing the multilayer reflector structure on a surface of the semiconductor structure opposing the emission surface.

In Example 22, the subject matter of Example 21 includes, wherein depositing the multilayer reflector structure comprises: forming a protective layer on the semiconductor structure, the protective layer substantially transparent to light of visible wavelengths; forming the narrowband reflector on the protective layer; and depositing an absorbing layer configured to absorb the light of visible wavelengths on the narrowband reflector.

In Example 23, the subject matter of Example 22 includes, wherein depositing the multilayer reflector structure further comprises: using photolithographic processes to form a via in the protective layer and narrowband reflector; and filling the via with a conductive material configured to electrically contact the semiconductor structure.

In Example 24, the subject matter of Examples 20-23 includes, coupling control circuitry to individually drive each of the micro-LEDs in the micro-LED array.

Example 25 is at least one machine-readable medium including instructions that, when executed by processing circuitry, cause the processing circuitry to perform operations to implement of any of Examples 1-24.

Example 26 is an apparatus comprising means to implement of any of Examples 1-24.

Example 27 is a system to implement of any of Examples 1-24.

Example 28 is a method to implement of any of Examples 1-24.

In the detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function.

The description uses the phrases "in an embodiment" or "in embodiments," which may each refer to one or more of the same or different embodiments. Furthermore, the terms "comprising," "including," "having," and the like, as used with respect to embodiments, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the detailed description, reference is made to the accompanying drawings that form a part hereof, showing, by way of illustration, some of the embodiments that may be practiced. In the drawings, same reference numerals refer to the same or analogous elements/materials so that, unless stated otherwise, explanations of an element/material with a given reference numeral provided in context of one of the drawings are applicable to other drawings where elements/materials with the same reference numerals may be illustrated. The accompanying drawings are not necessarily drawn to scale. Moreover, it will be understood that certain embodiments can include more elements than illustrated in a drawing, certain embodiments can include a subset of the elements illustrated in a drawing, and certain embodiments can incorporate any suitable combination of features from two or more drawings.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

In some examples provided herein, interaction may be described in terms of two, three, four, or more electrical components. However, this has been done for purposes of clarity and example only. It should be appreciated that the devices and systems described herein can be consolidated in any suitable manner. Along similar design alternatives, any of the illustrated components, modules, and elements of the accompanying drawings may be combined in various possible configurations, all of which are clearly within the broad scope. In certain cases, it may be easier to describe one or more of the functionalities of a given set of flows by only referencing a limited number of electrical elements.

As used herein, the states of switches may be referred to as "open" and "closed." In some embodiments, a switch may comprise a physical throw, where the term "open" may refer to the throw opening the circuit in which the switch is implemented preventing the flow of current and the term "closed" may refer to the throw completing the circuit in which the switch is implemented allowing the flow of current. In some embodiments, a switch may comprise a transistor, where the term "open" may refer to the transistor presenting a high resistance that allows a minimal amount of current to flow and the term "closed" may refer to the transistor presenting that allows a large amount of current to flow. Further, when referring to a switch comprising a transistor allowing current flow or preventing current flow, it should be understood that current flow when the switch is allowing current flow may be an amount of current flow through the transistor when "closed" and the current flow when the switch is preventing current flow may be an amount of current flow through the transistor when "open" (which may be non-zero in some instances). It should be understood that the amount of current allowed to the flow through the transistor when "open" and when "closed" can be dependent on the characteristics of the transistor, and the terms "open" and "closed" are to be interpreted as one having ordinary skill in the art would understand when referring to a transistor being utilized as a switch.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

It should be appreciated that the electrical circuits of the accompanying drawings and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

In some embodiments, any number of electrical circuits of the accompanying drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on a particular configuration, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the accompanying drawings may be implemented as stand-alone modules (e.g., a device with associated components and circuitry configured to perform a specific application or function) or implemented as plug-in modules into application specific hardware of electronic devices. Note that some embodiments may be readily included in a system on chip (SOC) package, either in part, or in whole. An SOC represents an integrated circuit (IC) that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, components and/or procedures described herein may be implemented in one or more silicon cores in Application Specific Integrated Circuits (ASICs), Field Programmable Gate Arrays (FPGAs), and other semiconductor chips.

It is also important to note that the functions related to components and/or procedures described herein and/or the procedure may illustrate some of the possible functions that may be executed by, or within, the systems described herein. Some of these operations may be deleted or removed where appropriate, or these operations may be modified or changed considerably without departing from the scope. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of any of the devices and systems described herein may also be implemented with respect to the methods or processes described herein and specifics in the examples may be used anywhere in one or more embodiments.

The invention claimed is:
1. A micro-light-emitting diode (LED) comprising:
a semiconductor structure containing an active region configured to emit light of a predetermined visible wavelength range;
a multilayer reflector structure disposed on a surface of the semiconductor structure opposing an emission surface of the semiconductor structure, the multilayer reflector structure including a narrowband reflector configured to have a maximum reflectance at the predetermined visible wavelength range and to reflect the light emitted by the active region towards the emission surface of the semiconductor structure;

a protective layer disposed between the narrowband reflector and the semiconductor structure, the protective layer substantially transparent to light of visible wavelengths;

a transparent conductive film disposed between the protective layer and the semiconductor structure, the transparent conductive film disposed on the semiconductor structure; and an anti-reflecting coating disposed at an interface between transparent conductive film and the protective layer.

2. The micro-LED of claim 1, wherein the protective layer comprises silicon dioxide.

3. The micro-LED of claim 1, wherein the multilayer reflector structure further comprises an absorbing layer configured to absorb the light of visible wavelengths, the narrowband reflector disposed between the absorbing layer and the semiconductor structure.

4. The micro-LED of claim 3, wherein the absorbing layer comprises TiW.

5. The micro-LED of claim 1, further comprising:
an encapsulant that encapsulates the semiconductor structure and the multilayer reflector structure, the encapsulant transparent to visible light.

6. The micro-LED of claim 1, wherein the narrowband reflector comprises a distributed Bragg reflector (DBR).

7. The micro-LED of claim 1, further comprising an eVia comprising a conductive material configured to electrically contact the semiconductor structure, the multilayer reflector structure laterally surrounding the e Via.

8. The micro-LED of claim 7, wherein:
the conductive material comprises Cu plated with AgTiW to contact a p doped region of the semiconductor structure, and
a Cu layer with thin layer of Al contacts sidewalls of an n doped region of the semiconductor structure.

9. The micro-LED of claim 1, wherein the active region comprises a multi-quantum well structure.

10. A micro-light-emitting diode (LED) system comprising:
a plurality of micro-LEDs configured to emit light of different wavelength ranges, each micro-LED comprising:
a semiconductor structure containing an active region configured to emit light of a predetermined visible wavelength range;
a multilayer reflector structure that includes a distributed Bragg reflector (DBR) configured to have a maximum reflectance at the predetermined visible wavelength range and to reflect the light emitted by the active region towards an emission surface of the semiconductor structure;
a protective layer disposed between the DBR and the semiconductor structure, the protective layer substantially transparent to light of visible wavelengths;
a transparent conductive film disposed between the protective layer and the semiconductor structure, the transparent conductive film disposed on the semiconductor structure; and
an anti-reflecting coating disposed at an interface between transparent conductive film and the protective layer; and
control circuitry configured to individually drive each of the micro-LEDs.

11. The micro-LED system of claim 10, wherein:
the multilayer reflector structure is disposed on a surface of the semiconductor structure opposing the emission surface, and
the multilayer reflector structure further comprises:
an absorbing layer configured to absorb the light of visible wavelengths, the DBR disposed between the absorbing layer and the semiconductor structure.

12. The micro-LED system of claim 10, wherein:
each micro-LED further comprises an eVia comprising a conductive material configured to electrically contact the semiconductor structure, the multilayer reflector structure of the micro-LED laterally surrounds the e Via, and
the control circuitry is configured to control activation of the micro-LED through the eVia.

13. A micro-light-emitting diode (LED) comprising:
a semiconductor structure containing an active region configured to emit light of a predetermined visible wavelength range;
a multilayer reflector structure that includes a narrowband reflector configured to have a maximum reflectance at the predetermined visible wavelength range and to reflect the light emitted by the active region towards an emission surface of the semiconductor structure; and
an eVia comprising a conductive material configured to electrically contact the semiconductor structure, the multilayer reflector structure laterally surrounding the eVia,
wherein the conductive material comprises Cu plated with AgTiW to contact a p doped region of the semiconductor structure, and a Cu layer with thin layer of Al contacts sidewalls of an n doped region of the semiconductor structure.

14. The micro-LED of claim 13, wherein the multilayer reflector structure is disposed on a surface of the semiconductor structure opposing the emission surface.

15. The micro-LED of claim 14, wherein the multilayer reflector structure further comprises a protective layer disposed between the narrowband reflector and the semiconductor structure, the protective layer substantially transparent to light of visible wavelengths.

16. The micro-LED of claim 15, wherein the protective layer comprises silicon dioxide.

17. The micro-LED of claim 13, wherein the multilayer reflector structure further comprises an absorbing layer configured to absorb the light of visible wavelengths, the narrowband reflector disposed between the absorbing layer and the semiconductor structure.

18. The micro-LED of claim 15, further comprising a transparent conductive film disposed between the protective layer and the semiconductor structure, the transparent conductive film disposed on the semiconductor structure.

19. The micro-LED of claim 13, further comprising:
an encapsulant that encapsulates the semiconductor structure and the multilayer reflector structure, the encapsulant transparent to visible light; and
an anti-reflecting coating disposed at an interface between the encapsulant and air.

20. The micro-LED of claim 13, further comprising:
an encapsulant that encapsulates the semiconductor structure and the multilayer reflector structure, the encapsulant transparent to visible light; and
an anti-reflecting coating disposed at an interface between the encapsulant and the semiconductor structure.

* * * * *